May 23, 1967 F. J. BOLDA ET AL 3,320,658

METHOD OF MAKING ELECTRICAL CONNECTORS AND CONNECTIONS

Filed June 26, 1964

2 Sheets-Sheet 1

INVENTORS
FRANK J. BOLDA
JOHN T. GULLIKSEN
HERBERT K. HAZEL

BY [signature]

AGENT

May 23, 1967 F. J. BOLDA ET AL 3,320,658

METHOD OF MAKING ELECTRICAL CONNECTORS AND CONNECTIONS

Filed June 26, 1964 2 Sheets-Sheet 2

United States Patent Office 3,320,658

Patented May 23, 1967

3,320,658

METHOD OF MAKING ELECTRICAL CONNECTORS AND CONNECTIONS

Frank J. Bolda, Poughkeepsie, John T. Gulliksen, Peekskill, and Herbert K. Hazel, Poughkeepsie, N.Y., assignors to International Business Machines Corporation, New York, N.Y., a corporation of New York Filed June 26, 1964, Ser. No. 378,128

4 Claims. (Cl. 29—155.5)

This invention relates to miniaturized electrical elements. More particularly, it relates to miniaturized conductive elements in a matrix of insulative material.

Continuous efforts to increase the information handling capacity of data processing machines have been paralleled by efforts to drastically reduce the size of such equipment. It was not unusual for circuit cards in some early tube-type machines to have areas approximately twenty square inches. By contrast, the area of the basic component support substrate in the most modern machines comprises roughly a quarter of an inch. In early computers employing vacuum tubes as active elements, tube sockets were used to provide the connecting link between the tubes and the supporting substrate (e.g., printed circuit card). These tube sockets varied from more than an inch in diameter to perhaps half an inch in diameter. In the most modern equipment, employing chip-type semiconductors as the active elements, tiny conductive spheres are now utilized to establish electrical and mechanical connection between the active elements and the passive supporting substrate. These spheres may be anywhere from two thousandths to five thousandths of an inch in diameter.

As the use of different electronic elements became more widespread, automated equipment and procedures were developed to cope with handling them. Even with such automated equipment, the need for manual operations still existed. But, manually handling larger components (e.g., grasping a half-inch diameter tube socket) did not pose any unusually difficult problems. However, when the decision was made to employ tiny conductive spheres as interconnectors, the materials handling problem was significantly increased. Similarly, the making of electrical interconnections themselves became more difficult as a result of this equipment miniaturization.

It was still possible to convey the spheres from their point of manufacture to the point of utilization in standard bulk packages; i.e., in large containers. Upon arrival at the fabrication facility, it became necessary to distribute the spheres in predetermined quantities to a number of assembly locations throughout the factory. Then, upon arrival at a particular assembly location, it was necessary for the spheres to be so packaged that an operator could readily manipulate them to a desired work station; for example, position them between an active semiconductive element and a passive substrate. None of the latter operations could expediently be practiced by hand, even if the operator had an unusual degree of dexterity.

Accordingly, it is a general object of this invention to eliminate many of the problems associated with such tiny conductive elements.

A more particular object is to provide an improved method of forming an integral structure comprising a plurality of miniaturized conductive elements within a rigid matrix.

A further object of this invention is to provide an improved method of packaging miniaturized conductive elements within a thermoplastic carrier.

Another object of this invention is the provision of an improved electrical connector for forming localized interconnections between miniaturized conductors.

Yet another object of this invention is the provision of an improved electrical connector comprising a segment of a rigid package formed by the methods described.

A further object of this invention is to provide an improved method of making localized interconnections between small areas of miniaturized electrical conductors.

Still another object of this invention is the provision of an improved method of electrically interconnecting localized areas of miniaturized electrical conductors while simultaneously forming an insulating area between the non-joined areas of the conductors.

Accordingly, one aspect of our invention resides in providing an improved method for positioning miniaturized conductive elements within a rigid carrier. A plurality of the conductive elements are positioned in a predetermined pattern across the upper surface of a thermoplastic carrier. The individual conductive elements are heated or, alternatively, the thermoplastic carrier is heated to a temperature sufficient to soften the thermoplastic carrier, yet insufficient to deform the conductive element. During the heating process, the conductive element nestles in the softened thermoplastic carrier. Then, upon removal of the heat, the thermoplastic carrier resolidifies and rigidly supports the conductive elements.

It is another aspect of our invention to provide a plurality of miniaturized conductive elements partially enclosed by a thermoplastic carrier, which is inherently an electrical insulator. In a preferred form, the conductive elements are spherical in shape. The thermoplastic carrier essentially rings a portion of the periphery of each spherical conductive element.

In accordance with still another aspect of this invention, we provide an improved process of using the packaged, miniaturized, conductive elements to establish electrical interconnections between miniaturized conductors. One or more of the conductive elements, ringed by the insulative thermoplastic carrier, are positioned between a pair of electrical conductors. The conductive elements are so disposed that they will bridge those portions of the electrical conductors which are to be ultimately interconnected. By either welding, brazing or soldering, the conductive elements are firmly joined to the electrical conductors. At the same time, the heat thus generated is sufficient to soften the thermoplastic carrier, thereby filling the voids existing both between the conductors and adjacent to the now-formed electrical interconnections. Upon removal of this heat, the thermoplastic carrier resolidifies and provides insulation between those portions of the electrical conductors not electrically interconnected.

The invention disclosed offers a number of distinct advantages. Considering the problems present in manipulating vast numbers of exceptionally small elements, the desirability of the improved process for packaging such elements becomes apparent. The small elements may be handled by automatic apparatus and positioned upon the surface of a thermoplastic carrier without manual aid. Upon positioning, a very small amount of heat is sufficient to firmly embed them within the carrier. The few steps involved, and the relatively simple nature of them, makes this process exceptionally attractive from a time-equipment viewpoint.

Once the packaging process itself has been completed, the package formed offers distinct advantages. A number of the miniaturized conductive elements have been grouped within a single supporting medium and are rigidly positioned there. The supporting medium may then be picked up by manual or automated mechanisms and conveyed to a particular work station. At that point, the package may be split apart and individual conductive elements used to establish electrical interconnections.

However, should the electrical interconnection pattern have been decided beforehand, the package of supported elements may be so designed as to have the conductive elements reflect this pattern. In the latter form, the package lends itself to making a plurality of electrical interconnections simultaneously; this can be accomplished by interposing the package between the elements to be joined.

Thus, advantages may be gained from using the novel packaged conductive elements in a process for forming localized electrical interconnections. Electrical conductors may be joined with certainty at precisely determined locations due to the small size of the conductive elements. Further, localized electrical interconnections are guaranteed, because the insulative material will be set between the conductors by the heat employed. When dealing with such miniaturized elements, the insulative material surrounding them provides a handle for manipulating the conductive elements into place between the conductors to be connected. Thus, electrical interconnections that would prove extremely difficult to establish using conventional techniques become relatively simple to form using the novel packaged, miniaturized conductive elements.

The foregoing and other objects, features and advantages of the invention will be apparent from the following more particular description of the invention as illustrated in the accompanying drawings.

Figure 1:
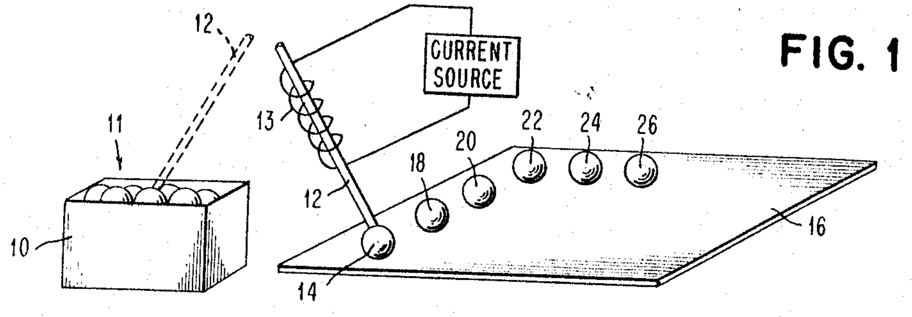
FIG. 1 shows typical apparatus for seating conductive elements within an insulative carrier.

Turning now to FIG. 1, apparatus for practicing the method of seating conductive elements within an insulative carrier is shown. The conductive elements are shown as having a spherical geometry, but they are not to be limited to this configuration. Although a spherical shape offers superior results in certain applications, a conductor having any geometry may be employed in this method—for example, a cylindrical geometry. Should spherical conductive elements be employed, it is contemplated that their diameter will be about one thousandth to five thousandths of an inch, although any convenient size may be chosen. A wide choice of insulative carrier materials is similarly available. The major requirements are that the carrier be a thermoplastic (i.e., deformable when heated) and that it have a tacky consistency when heated. Some typical materials which can be used (with their deformation temperatures in parentheses) are polyethylene terephthalate (450° F.) polyethylene coated polyethylene terephthalate (200–250° F.), polyethylene coated polytetrafluoroethylene (200–250° F.), polytetrafluoroethylene (500° F.), polyethylene (200–250° F.), and soda-lime glass (1280° F.). This list is not meant to be exhaustive, but merely illustrative; other suitable compounds may be used.

In FIG. 1, container 10 has a supply of conductive elements 11, preferably spheres, within it. These spheres are to be seated within carrier 16. In order to extract the conductive elements and convey them to carrier 16 vacuum feeder arm 12 is used. Feeder arm 12 dips into container 10, sucks up a sphere 14, and then travels to the vicinity of carrier 16. In order to heat sphere 14, feeder arm 12 is equipped with any well-known heating means (e.g., an electrical coil 13 wrapped around the body of arm 12). Sphere 14 is positioned upon the upper surface of carrier 16 in a predetermined location. By that time, sphere 14 has been heated to a temperature sufficient to soften the carrier material 16, but insufficient to deform sphere 14. Thus, when sphere 14 contacts carrier 16, carrier 16 is deformed and sphere 14 settles into it. Arm 12 is then removed from sphere 14 as sphere 14 is held by carrier 16. Sphere 14 and the surrounding carrier 16 are allowed to cool, and carrier 16 tightens about sphere 14 and maintains it in a rigid manner. Other spheres 18, 20, 22, 24, 26 are shown on carrier 16; they have been positioned previously by the novel process of this invention.

Recapping the essentials of this process, it comprises positioning a miniaturized conductive element upon the upper surface of a thermoplastic material, heating the conductive element so as to seat it within the thermoplastic material, and then cooling the array so as to allow the thermoplastic material to form a rigid bond to the conductive element.

Figure 2:
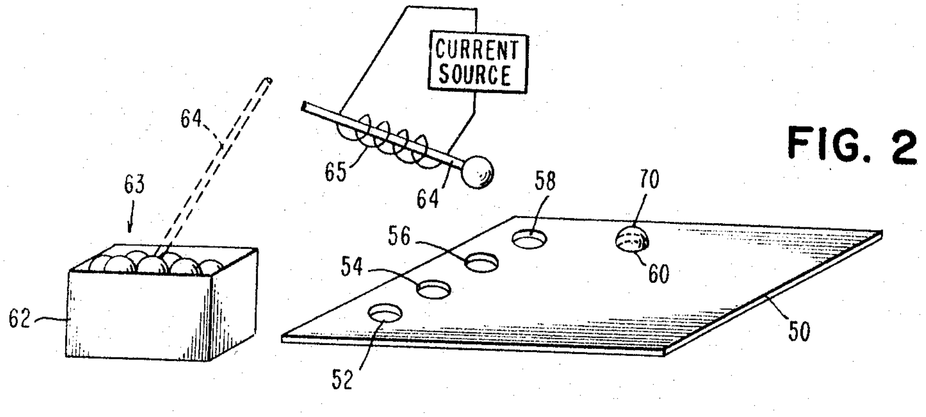
FIG. 2 shows typical apparatus for seating conductive elements within an insulative carrier having preformed holes.

As mentioned, the process may be practiced with a carrier material having preformed apertures so as to more readily accept the conductive elements; this is shown in FIG. 2. Carrier 50, has a plurality of apertures 52, 54, 56, 58 and 60. A container 62 having a supply of conductive elements 63 and a vacuum feeder arm 64 with a heating coil 65 are provided as in FIG. 1, and their functions are the same.

With reference to the process practiced in FIG. 2, vacuum feeder arm 64 extracts a sphere 68 from container 62 and deposits that sphere within an aperture (e.g., 58) in carrier 50. Sphere 68 is heated and transfers its heat to the surrounding material of carrier 50. Carrier 50, surrounding sphere 68, has already softened. Now, upon cooling, it resolidifies and firmly supports sphere 68. Previously positioned sphere 70 is shown within aperture 60. Sphere 68 would be supported in a similar manner.

Looking then at FIGS. 1 and 2 in parallel, it is clear that the carrier may either have the conductive elements seated upon one surface or seated within preformed apertures. The process works equally well in either embodiment and is felt to include both within its scope. Further, heat may be applied to either the conductive element or to the carrier, so long as the carrier is softened sufficiently to accept a conductive element.

Figure 3:
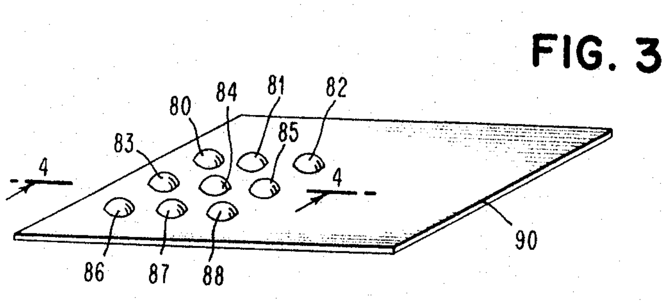
FIG. 3 represents an integral package formed by using the apparatus of FIG. 1 or 2 in the novel method set forth.

FIG. 3 shows a typical structure comprising a plurality of conductive spheres supported by a thermoplastic carrier. There many be N number of such spheres, but for convenience nine are shown and labeled 80–88 inclusive. Conductive spheres 80–88 may be fabricated from a number of different materials; the selection of materials is determined by the ultimate use of the conductive spheres. As a general rule, the spheres should be of a material that will adhere to the conductors which they are to join. For example, a commonly used material for joining copper conductors comprises an alloy of 80% copper, 15% silver, and 5% phosphorous; another such alloy comprises 95% copper and 5% phosphorous. Two molybdenum strips may be joined by using platinum spheres in a thermoplastic matrix. Two tungsten strips may be joined by spheres comprising 10% rhodium and 90% platinum.

The geometrical disposition of spheres 80–88 within carrier 90 of FIG. 3 is strictly one of choice. In practice, the arrangement of spheres 80–88 may be random or it may fit into a predetermined pattern.

Figure 4:
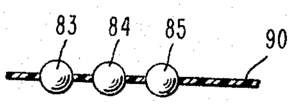
FIG. 4 is a sectional representation taken along the line 4—4 of FIG. 3.

Turning now to FIG. 4, a sectional view taken along the line 4—4 of FIG. 3 appears. Spheres 83, 84 and 85 are shown in cross section. They are supported by thermoplastic carrier 90. A portion of each sphere 83, 84, 85 extends above the surface of thermoplastic carrier 90 and another portion extends below the surface of thermoplastic carrier 90. Thus, each sphere (for example, 83) is partially enclosed by a marginal region of insulative material (thermoplastic carrier 90).

Figure 5:
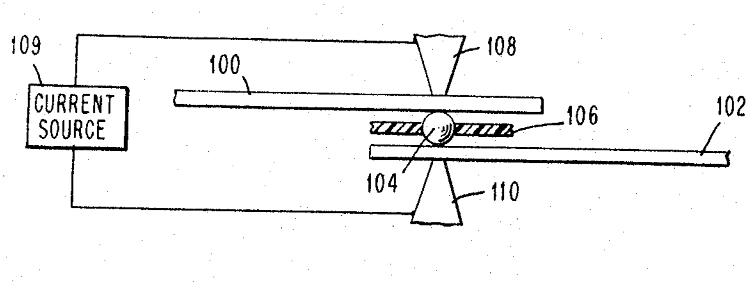
FIG. 5 shows typical apparatus for a method of making localized electrical interconnections using the novel packaged conductive element.

FIG. 5 shows a packaged conductive element being used to establish localized electrical connection between a plurality of electrical conductors. Electrical conductors 100, 102 are vertically aligned. They may be of any electrical conductor; some common examples of conductor materials, as well as materials for the conductive elements, were set forth previously. A problem existing in the prior art and solved as shown in FIG. 5 resides in establishing electrical interconnection between a small area of conductors 100, 102 and at the same time insulating the area surrounding the interconnected portions. One of the conductive elements, packaged according to the method set forth above, may be employed in a method of forming such a connection with excellent results.

With continued reference to FIG. 5, conductive sphere 104, having been seated within thermoplastic carrier 106, is positioned so as to abut both conductors 100, 102. The marginal region of thermoplastic carrier 106 surrounding conductive sphere 104 serves as a handle to precisely position conductive sphere 104. By grasping carrier 106, it is unnecessary to touch the sphere 104—and thus there is no danger of grease or oxides being deposited on sphere 104. Consequently, the electrical conductivity of the final interconnection is enhanced.

With continued reference to FIG. 5, the apparatus necessary to practice a preferred embodiment of the method is set forth. Excellent results have been obtained by welding or brazing conductive sphere 104 to electrical conductors 100, 102. Conductive sphere 104 should be fabricated from a metal capable of ultimately adhering to conductors 100, 102. Several illustrative examples were given previously. For instance, if conductors 100, 102 were copper, then sphere 104 could be an alloy of 80% copper, 15% silver, and 5% phosphorus. In order to complete the process by welding, for example, welding electrodes 108, 110 are brought into contact with conductors 100, 102; electrodes 108, 110 are axially aligned with sphere 104. If the materials specified immediately above are used, a current sufficient to raise the temperature of the structure to roughly 1175° F. is then passed from current source 109 through electrodes 108, 110 and sphere 104. The heating effect is concentrated on sphere 104 and it decomposes. Thus, sphere 104 flows in the region between conductors 100, 102, and the heat generated softens thermoplastic carrier 106. Upon removal of the heat, the spherical element 104 resolidifies as does thermoplastic carrier 106. A firm joint establishing electrical interconnection has thus been provided between conductors 100, 102. In a like manner, thermoplastic carrier 106 resolidifies and establishes an electrical insulative barrier between conductors 100, 102 in the region surrounding the now deformed sphere 104.

Should it be decided to employ soldering techniques, as opposed to welding techniques, it would then be necessary to cover sphere 104 with a flux. Solder could then be flowed within the region outlined by conductor 100, 102. The heat generated during the soldering process would cause the thermoplastic carrier 106 to soften, while at the same time sphere 104 was being joined to conductors 100, 102. Then, upon removal of the heat, a firm electrical joint would be established between conductors 100 and 102 and that joint would be surrounded by an insulative barrier established by the resolidified thermoplastic carrier 106.

As noted before various combinations of materials can be used. Even a nonelectrical interconnection may be formed between two conductors. For instance, two conductors of tantalum could be joined by a glass sphere supported in a thermoplastic carrier. A laser beam could be concentrated on the glass, or an electron beam, so as to melt the glass.

If a solder process was used where the metals to be joined required a fluxing or a cleaning step, then a closed system could be used. An inert gas could be flowed through such a system to carry away vapors resulting from the fluxing or cleaning step. Even oxidizable metals like aluminum could then be joined.

Figure 6:
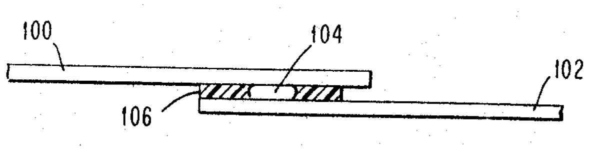
FIG. 6 is an elevation view showing a plurality of electrical conductors having a localized electrical interconnection.

FIG. 6 shows a horizontal elevation of a structure formed by the process just discussed. Eelectrical conductors 100, 102 are shown with deformed spherical element 104 disposed between them, and establishing a localized electrical connection. Further, deformed spherical element 104 is surrounded by the thermoplastic carrier 106 so as to insulate the areas of conductors 100, 102 adjacent to the electrical connection.

Figure 7:
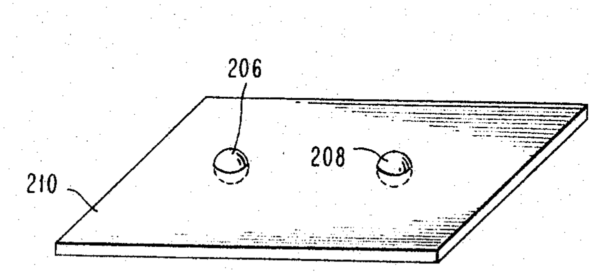
FIG. 7 shows a package of conductive elements capable of being used to form a plurality of localized electrical interconnections.
Figure 8:
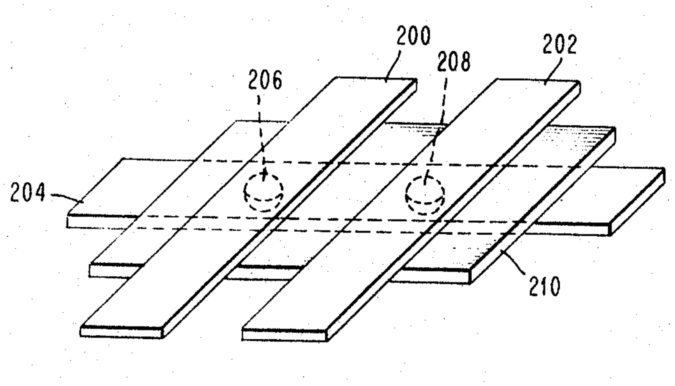
FIG. 8 shows the package of FIG. 7 forming a number of localized electrical interconnections between a plurality of electrical conductors.

FIG. 7 taken in conjunction with FIG. 8, shows how a package of conductive elements may be used to establish a plurality of electrical interconnections in a simple process. A designer calculates the spatial relation between the necessary contact locations formed by a plurality of electrical conductors. An electrical connector package is then laid out in which the conductive spheres are disposed in the calculated spatial relationship within the thermoplastic carrier.

Looking first at FIG. 8, three conductors 200, 202, 204 are shown. Conductors 200, 202 are parallel to each other and displaced vertically from conductor 204. Further, conductors 200, 202 are at right angles to conductor 204. Suppose that an electrical interconnection is to be established between conductor 200 and 204, as well as between conductor 202 and 204. The two points of intersection would establish a straight line having a particular length.

Turning now to FIG. 7, a package fabricated for this purpose by the novel process of this invention is shown. Two conductive spheres 206, 208 are supported in thermoplastic carrier 210. Conductive spheres 206, 208 form two points along a straight line, and the distance between them is equal to the distance between the center of conductor 200 and the center of conductor 202. Thus, the package of FIG. 7 may be used in a process to establish electrical interconnection between conductors 200, 202, 204.

With reference to FIG. 8 again, the conductive package of FIG. 7 is shown interposed between conductors 200, 202, 204. In a prferred embodiment, welding current passed between conductor 204 and conductors 200, 202 deforms spheres 206, 208 as well as thermoplastic carrier 210. In the alternative, a soldering process could be used. When the heat of either process is removed, conductive spheres 206, 208 harden in place and electrically and mechanically join conductors 200, 202 to conductor 204. Further, thermoplastic carrier 210 resolidifies and insulates the nonjoined regions of conductors 200, 202 and 204.

FIG. 7 and FIG. 8 are meant to be illustrative only of a technique of tailoring the pattern of conductive spheres on a thermoplastic carrier to the ultimate pattern of a number of electrical interconnections. In this manner, a package comprising the conductive spheres embedded in a thermoplastic carrier may be used in a process of simultaneously forming a plurality of localized electrical interconnections between electrical conductors.

While the invention has been particularly shown and described with reference to preferred embodiments of it, it will be understood by those skilled in the art that the foregoing and other changes in form and details may be made without departing from the spirit and scope of the invention.

We claim:

1. A method of forming a miniaturized electrical connector for joining miniaturized electrical conductors comprising the steps of:

positioning a miniaturized spherical conductive member within an aperture in a polyethylene coated polyethylene terephthalate carrier, by means of a vacuum feeder arm;

heating said spherical conductive member and said insulative material to a point below the deformation temperature of said spherical conductive member causing said spherical conductive member to seat within said insulative material; and cooling said spherical conductive member and said insulative material so as to rigidly position said conductive member within said insulative material.

2. A method of forming a miniaturized electrical connector for joining miniaturized electrical conductors comprising the steps of:

positioning a spherical conductive member within a preformed aperture in a polyethylene coated polyethylene terephthalate carrier by means of a vacuum feeder arm;

heating said spherical conductive member and said carrier to the vicinity of 250° F. said temperature being sufficient for softening the carrier but insufficient for softening the conductive member;

forming said carrier about said conductive member; and cooling said conductive member and said carrier, so as to rigidly position said spherical conductive member within said carrier.

3. A method of forming a miniaturized conductive connection between a plurality of electrical conductors comprising:

positioning at least two electrical conductors in a spaced relationship; placing a solder flux on the opposed surfaces of said electrical conductors;

placing an insulation-supported conductive rigid sphere between the spaced electrical conductors; and heating said insulation-supported conductive rigid sphere so as to adhere said rigid sphere and said insulation to said electrical conductors and thereby join said electrical conductors.

4. A method of forming a plurality of miniaturized conductive connections between a plurality of electrical conductors comprising the steps of:

positioning a plurality of spherical conductive members on one surface of a thermoplastic insulative material;

seating said spherical conductive members within said insulative material by heating said conductive members and said insulative material to a point below the deformation temperature of said spherical conductive members;

rigidly positioning said conductive members within said insulative material by cooling said conductive members and said insulative material;

positioning at least two electrical conductors on opposite sides of said insulative material and in contact with said conductive members;

thermally joining said spherical conductive members, said thermoplastic insulative material, and said electrical conductors by heating said spherical conductive members to a point above their deformation temperature, thereby forming a plurality of electrical connections between said electrical conductors, each of said connections passing through said insulative material.

References Cited by the Examiner

UNITED STATES PATENTS

| | | | |
|---|---|---|---|
| 3,057,952 | 10/1962 | Gordon | 174—117 |
| 3,070,650 | 12/1962 | Stearns | 174—68.5 X |
| 3,077,511 | 2/1963 | Bohrer et al. | 174—68.5 |
| 3,107,414 | 10/1963 | Sterling | 174—68.5 X |
| 3,148,310 | 9/1964 | Feldman | 174—68.5 X |
| 3,184,831 | 9/1965 | Siebertz | 29—155.5 |
| 3,201,509 | 8/1965 | Batzle | 174—50.61 |
| 3,210,831 | 10/1965 | Johnson et al. | 338—327 |

FOREIGN PATENTS

| | | |
|---|---|---|
| 215,968 | 7/1958 | Australia. |
| 940,518 | 10/1963 | Great Britain. |

References Cited by the Applicant

UNITED STATES PATENTS

| | | |
|---|---|---|
| 2,521,992 | 9/1950 | Nielsen. |

LEWIS H. MYERS, *Primary Examiner.*

DARRELL L. CLAY, *Examiner.*